US010782351B2

(12) United States Patent
Freire (10) Patent No.: US 10,782,351 B2
(45) Date of Patent: Sep. 22, 2020

(54) DIAGNOSING A WINDING SET OF A STATOR

(71) Applicant: Siemens Gamesa Renewable Energy A/S, Brande (DK)

(72) Inventor: Nuno Miguel Amaral Freire, Brande (DK)

(73) Assignee: Siemens Gamesa Renewable Energy A/S (DK)

( * ) Notice: Subject to any disclaimer, the term of this patent is extended or adjusted under 35 U.S.C. 154(b) by 128 days.

(21) Appl. No.: 16/177,644

(22) Filed: Nov. 1, 2018

(65) Prior Publication Data

US 2019/0137568 A1 May 9, 2019

(30) Foreign Application Priority Data

Nov. 7, 2017 (EP) .................................. 17200346

(51) Int. Cl.
*G01R 31/34* (2020.01)
*F03D 9/25* (2016.01)
(Continued)

(52) U.S. Cl.
CPC ............. *G01R 31/346* (2013.01); *F03D 9/25* (2016.05); *F03D 17/00* (2016.05); *G01R 31/343* (2013.01);
(Continued)

(58) Field of Classification Search
CPC ..... G01R 31/343; G01R 31/346; H02P 9/006; H02P 9/007; H02P 9/008; H02P 9/10;
(Continued)

(56) References Cited

U.S. PATENT DOCUMENTS

| 5,929,612 A | 7/1999 | Eisenhaure et al. |
| 8,907,509 B2 * | 12/2014 | Brogan ................... H02M 1/12 |
| | | 290/43 |

(Continued)

OTHER PUBLICATIONS

Yun, Jangho, et al., "Detection and Classification of Stator Turn Faults and High Resistance Electrical Connections for Induction Machines", IEEE Transactions on Industry Applications, pp. 1923-1931, 2009.

(Continued)

*Primary Examiner* — Minh N Tang
(74) *Attorney, Agent, or Firm* — Schmeiser, Olsen & Watts LLP (57) ABSTRACT

Provided is a method of diagnosing at least one winding set of a stator of a generator during operation, the winding set having plural wires for plural phases, the method including: obtaining, for each of the plural wires of the winding set, an individual strength of an individual power output from the respective wire of the plural wires of the winding set; obtaining a sum strength of power; forming, for each considered wire of the plural wires of the winding set, an individual ratio between the individual strength of the considered wire and the sum strength; forming, for each considered wire of the plural wires of the winding set, a diagnostic value by subtracting from an individual ratio not corresponding to the considered wire a term depending on the individual ratio corresponding to the considered wire; diagnosing at least one wire based on comparing the diagnostic values.

15 Claims, 3 Drawing Sheets (51) Int. Cl.
*F03D 17/00* (2016.01)
*H02P 9/00* (2006.01)
*H02P 101/15* (2016.01)

(52) U.S. Cl.
CPC .......... *H02P 9/006* (2013.01); *F05B 2260/80* (2013.01); *H02P 2101/15* (2015.01)

(58) Field of Classification Search
CPC ... F03D 9/22; F03D 9/25; F03D 9/255; F03D 9/257; F03D 17/00
See application file for complete search history.

(56) References Cited

U.S. PATENT DOCUMENTS

| | | |
|---|---|---|
| 9,983,253 B2* | 5/2018 | Hao ..................... G01R 31/346 |
| 2011/0260748 A1 | 10/2011 | Hong |
| 2012/0050053 A1 | 3/2012 | Kim |
| 2014/0191697 A1 | 7/2014 | Mao et al. |
| 2015/0309107 A1 | 10/2015 | Roedel |

OTHER PUBLICATIONS

Mengoni, Michele, et al., "Online Detection of High-Resistance Connections With Negative-Sequence Regulators in Three-Phase Induction Motor Drives", IEEE Transactions on Industry Applications, vol. 51, No. 2, pp. 1579-1586, Mar./Apr. 2015.
Briz, Fernando, et al., "Stator Windings Fault Diagnostics of Induction Machines Operated From Inverters and Soft-Starters Using High-Frequency Negative-Sequence Currents", IEEE Transactions on Industry Applications, vol. 45, No. 5, pp. 1637-1646, Sep./Oct. 2009.
Drif, M'hamed, et al., "Stator Fault Diagnostics in Squirrel Cage Three-Phase Induction Motor Drives Using the Instantaneous Active and Reactive Power Signature Analyses", IEEE Transactions on Industrial Informatics, vol. 10, No. 2, pp. 1348-1360, May 2014.
Wu Zhiqiao et al: "High-Performance Control of a Dual Stator Winding DC Power Induction Generator", IEEE Transactions on Industry Applications, IEEE Service Center, Piscataway, NJ, US, vol. 43, No. 2, pp. 582-592, XP011175041, ISSN: 0093-9994, Mar./Apr. 2007.
Yun, Jangho, et al., "Online Detection of High-Resistance Connections in the Incoming Electrical Circuit for Induction Motors", IEEE Transactions on Industry Applications, vol. 45, No. 2, pp. 694-702, Mar./Apr. 2009.
De la Barrera, Pablo M., et al.; "High-Resistance Connection Detection in Induction Motor Drives Using Signal Injection", IEEE Transactions on Industrial Electronics, vol. 61, No. 7, pp. 3563-3573, Jul. 2014.
Zarri, Luca, et al., "Detection and Localization of Stator Resistance Dissymmetry Based on Multiple Reference Frame Controllers in Multiphase Induction Motor Drives" IEEE Transactions on Industrial Electronics, vol. 60, No. 8, pp. 3506-3518, Aug. 2013.
Mengoni, Michele, et al., "Online Detection of High-Resistance Connections in Multiphase Induction Machines", IEEE Transactions on Power Electronics, vol. 30, No. 8, pp. 4505-4513, Aug. 2015.

* cited by examiner

DIAGNOSING A WINDING SET OF A STATOR

CROSS-REFERENCE TO RELATED APPLICATIONS

This application claims priority to EP Application No. 17200346.9, having a filing date of Nov. 7, 2017, the entire contents of which are hereby incorporated by reference.

FIELD OF TECHNOLOGY

The following relates to a method and to an arrangement for diagnosing at least one winding set of a stator of a generator during operation. Further, embodiments of the present invention relate to a generator comprising the arrangement.

BACKGROUND

A multi-stator electrical machine comprises a stator having one, two or more sets of windings. One or more of the winding sets may be faulty due to several reasons. For example, high resistance connections usually may result from loose connections (due to poor workmanship, thermal cycling and vibrations or damage of the contact surfaces due to pitting, corrosion or contamination) which may evolve to open-circuit faults. Furthermore, secondary damages may be expected as a consequence of overheating and excessive vibrations, some examples are insulation damages, melting of copper conductors, short-circuit faults and fire. Therefore, taking into account the high economic impact of such fault scenarios, ultimately leading to generator replacement, it is of vital importance to incorporate reliable diagnostic methods into the converter/turbine controller to protect a wind turbine and in general a generator. Ideally, a diagnostic method should be able to detect a fault at an early stage without generating false alarms.

Some of conventionally used techniques to detect high resistance connections in a stator of a generator may be based on: visual inspections with the aid of infrared thermography; standstill/offline tests (for example resistance measurements); analysis of negative sequence components in phase currents and/or voltages; zero sequence voltages; and high frequency signal injection. Conventionally, diagnosis of stator asymmetries may focus on the detection of short-circuit turns, showing fault signatures somehow similar to high resistance connections.

Even after, in a multi-winding set stator, the faulty set of windings has been detected and localized, the faulty phase may remain unknown. Thus, a required service action cannot be taken. In case of early fault detection with no visible overheating damages, a large number of connections may be needed to be inspected, resulting in a complex service intervention as well as long downtime of a wind turbine harbouring the generator.

Thus, there may be a need for a method and for an arrangement for diagnosing at least one winding set of a stator of a generator, in particular of a wind turbine, during operation, wherein reliable diagnosing may be ensured, in particular with respect to which phase or wire of the winding set is affected by the fault, such as high resistance.

SUMMARY

An aspect relates to methods and systems enabling to localize the faulty phase, drastically reducing the service time. Thus, taking as an example a three-phase generator, only a third of the connections need to be inspected compared to the state of the art.

Embodiments of the present invention provide a fault localization method and system intended for online condition monitoring of generators, in particular employed in wind turbines. In particular, the phase with a high resistance connection of the corresponding wire in a permanent magnet generator may be localized using embodiments of the present invention, enabling the converter controller to flag the faulty phase and enabling taking measures to fix or repair the wire or connection corresponding to the faulty phase.

Embodiments of the present invention may detect high resistance connections or short-circuit turns, converter open-circuit faults, current sensors faults, electrical and magnetic asymmetry and static eccentricity. Thus, embodiments of the present invention are not restricted of detecting high resistance connections of one or more winding sets of a stator of a generator.

Concerning fault localization, different fault types (short-circuit turns, converter open-circuit faults, current sensors faults) may require the modification of diagnostic signals proposed here.

According to an embodiment of the present invention it is provided a method of diagnosing at least one winding set of a stator of a generator during operation, the winding set having plural wires for plural phases, the method comprising: obtaining, for each of the plural wires of the winding set, an individual strength of an individual power output from the respective wire of the plural wires of the winding set; obtaining a sum strength of power; forming, for each considered wire of the plural wires of the winding set, an individual ratio between the individual strength of the considered wire and the sum strength; forming, for each considered wire of the plural wires of the winding set, a diagnostic value by subtracting from an individual ratio not corresponding to the considered wire a term depending on the individual ratio corresponding to the considered wire; diagnosing at least one wire based on comparing the diagnostic values.

The method may be implemented in software and/or hardware and may in particular execute during operation of the generator (in particular a wind turbine generator), for example carried out by a wind turbine controller or a converter controller.

The winding set of the stator may in particular be a three-phase winding set, comprising one wire for each of the three phases. The three wires may be wound around or within slots between teeth of the stator. The three wires of the winding set may be commonly connected at a connection point in a star configuration for example. At the free ends of the three wires, respective current and voltage may be obtained, in particular measured during operation of the generator. The product of current and voltage for each of the wires of the winding set may correspond to the individual power of each wire of the plural wires of the winding set. The individual strength of the individual power may correspond to the level or amplitude of the individual power (in particular being an AC quantity). The individual power may be an oscillating signal or oscillating quantity.

The strength (i.e. the individual strength and the sum strength) may be obtained in a number of ways, for example as an amplitude, a level, a moving average or an rms value of the corresponding power.

To each considered wire of the plural wires (of one winding set or of plural winding sets), an individual ratio is associated which is obtained as a ratio between the individual strength of the considered wire and the sum strength. The sum strength may in particular be taken as an absolute value of a total power, in particular a DC value of the total power.

The diagnostic value for the considered wire is obtained by subtracting from an individual ratio not corresponding to the considered wire a term depending on the individual ratio corresponding to the considered wire. The term may for example be given by the individual ratio corresponding to the considered wire or may comprise additional quantities. The diagnosing of at least one wire of the winding set based on comparing the diagnostic values may not require any thresholds, in particular may not require to compare the diagnostic values with any thresholds but may comprise only to compare the diagnostic values with each other.

The conventional techniques may have the drawback that fault information in a common converter controlled generator is split between current and voltages and therefore the analysis of a single quantity may lead to misinterpretation. Furthermore, a conventionally inherent generator impedance unbalance may not be taken into account which may lead to erroneous fault localization.

Embodiments of the present invention may be based on the finding that a high resistance connection in a phase of an individual winding set of an electrical machine causes an additional voltage drop, resulting in asymmetric/unbalanced terminal voltages and/or phase currents. Despite the fact that most large machines are inherently unbalanced in some way, the variation between normal and faulty operation may be detected by a suitable condition monitoring method, according to embodiments of the present invention, and may be taken into account.

In particular, embodiments of the present invention may be applied for closed-loop control systems (i.e. vector controlled drives, direct torque controlled drives, etc.) in which the fault information contained in the electrical quantities may not be confined to phase currents as a consequence of adopted control strategies and controllers bandwidth. Therefore, the use of instantaneous powers which are evaluated according to embodiments of the present invention appears to be attractive, since fault information contained in currents and voltages is combined.

One basic idea of embodiments of the present invention may be to monitor the relative variations of the active instantaneous power for each generator phase. For example, in a conventional control system of a permanent magnet synchronous generator, measured phase currents and reference voltages or even measured voltages may be readily available and may be used for diagnostic purposes without increasing cost and equipment. Thus, embodiments of the present invention may in particular be applied to a permanent magnet synchronous generator.

The method may for example be performed by a wind turbine controller having a processor including an arithmetic/logic unit.

According to an embodiment of the present invention, that wire is diagnosed as faulty to which the largest diagnostic value is associated. Thereby, no thresholds may be required for identifying the faulty wire. It may have previously been determined; that the considered winding set is faulty as such, without knowing which phase or which wire of the identified winding set is affected.

According to an embodiment of the present invention, the diagnostic value of the considered wire is formed by subtracting from one individual ratio not corresponding to the considered wire at least a mean value of all individual ratios except the one individual ratio.

The individual ratios are obtained in a simple manner by considering electrical quantities, such as voltage and current which may be available in a conventional controller of the generator, in particular wind turbine controller. The current may be measured or estimated, the voltage may be measured or estimated or a reference voltage which may be supplied to the wind turbine controller may be taken as the actual voltage.

By forming this difference, a comparison of the individual ratio corresponding to the considered wire and the ratios of the other wires may be enabled. It may be expected, that the individual ratio corresponding to the faulty wire is smaller than the individual ratio of all other wires, since due to high resistance (due to a fault), the corresponding power output is inspected to be decreased. Thereby, a simple method for localizing and identifying the faulty wire may be provided.

According to an embodiment of the present invention, the diagnostic value of the considered wire is formed by subtracting from one individual ratio not corresponding to the considered wire at least the individual ratio corresponding to the considered wire. If it is specified that at least the individual ratio is subtracted, it means that additionally also other quantities may be subtracted. If the individual ratio not corresponding to the considered wire is larger than the individual ratio or corresponding to the considered wire, the diagnostic value of the considered wire will be higher than the diagnostic value corresponding to the not considered wire. Thereby, a reliable diagnosis may be provided.

According to an embodiment of the present invention, the diagnostic value of the considered wire is formed by further subtracting a diagnostic value of the considered wire obtained in a healthy state of the considered wire. When further the diagnostic value of the considered wire obtained in a healthy state of the considered wire is subtracted, an inherent imbalance for example of the impedance of the different wires of the winding set is taken into account. Thereby, the reliability and accuracy of the method may further be improved and the number of false positives may be decreased.

According to an embodiment of the present invention, the sum strength of power is a DC value of the sum of powers of all wires. The DC value of the sum of the powers or of the individual power may be obtained as a moving average or by low-pass filtering of the corresponding instantaneous power.

By dividing by the sum strength of power, a normalization may be obtained. In a healthy state, each one of the individual ratios is expected to be 1/N, wherein N is the number of phases or number of wires of the winding set. If the individual ratio deviates from this expected value in a healthy state and is in particular smaller than this expected value, it may indicate that the corresponding wire is faulty.

According to an embodiment of the present invention, the individual strength of the individual power of the considered wire is an rms-value or a DC value of the individual power output by the considered wire. The rms-value may be computed as the square root of an integral of the squared power, the integral taken over a time interval which corresponds to at least one period of the oscillating power and dividing the integral by the time interval. The strength may in particular correspond to or be equal to an amplitude or a level of the power. Thereby, simple method steps are required to compute or obtain the individual strength.

According to an embodiment of the present invention, it has previously been diagnosed that the winding set is faulty by performing a method of diagnosing a first winding set and at least one second winding set of a stator of a generator during operation, the method comprising: obtaining a first strength of a second harmonic of a first power produced from the first winding set; obtaining a second strength of a second harmonic of a second power produced from the second winding set; diagnosing the first winding set and/or the second winding set based on a second harmonic power difference between the first strength and the second strength.

This embodiment may apply to a generator having multiple winding sets. The first winding set and the at least one second winding set may in particular be multiphase winding sets, such as three-phase winding sets. Thereby, each winding set may comprise multiple wires, such as three wires, which are wound around teeth in slots of a stator yoke. Different winding schemes may be applied.

The generator may further comprise a rotor rotatably supported relative to the stator, wherein in particular plural permanent magnets are attached at the rotor. Upon rotation of the rotor, voltages are induced in the single winding set of the first winding set and in the at least one second winding set enabling production of electric energy. The method may be performed while the rotor rotates relative to the stator and while the generator produces electric energy.

Depending on a rotational speed of the rotor rotating relative to the stator, the generator may output at the first winding set and the second winding set respective AC power fluxes or power streams. Thereby, the first power and the second power is given by the voltages and currents being carried in the first winding set and the second winding set, respectively. The first power as well as the second power may comprise active power and/or reactive power. According to embodiments of the present invention, only the reactive power component (of the first and the second winding set) is used for diagnosing or only the active power component is used for diagnosing or both, the active power component and the reactive power component are utilized for diagnosing the first winding set and the at least one second winding set.

The second harmonic may be an oscillation (of the output voltage and/or output current of the respective winding set) which oscillates with two times a fundamental electrical frequency of the generator. In the ideal case where no deterioration or fault is present, any of the winding sets is expected to only deliver a power stream of the fundamental electrical frequency such that the second harmonic is essentially zero. In the case that the second harmonic of the respective power is not zero or not smaller than a threshold, it may already indicate that the respective winding set is at least partially faulty.

The first strength of the second harmonic and the second strength of the second harmonic may be obtained or defined as an amplitude of the oscillation having a frequency of two times the fundamental electrical frequency. The second harmonic power difference is the difference between the first strength of the second harmonic of the first power and the second strength of the second harmonic of the second power. If there is a deviation between the first strength and the second strength it may indicate that one of the winding sets, in particular the one which has the higher strength of the second harmonic, is at least partly faulty, such as exhibiting high resistance connections or loose connections or other deficiencies.

A high resistance connection in at least one phase of an electric machine may cause an additional voltage drop, resulting in asymmetric/unbalanced terminal voltages and/or phase currents. Thus, if a high resistance connection is present in one of the winding sets, the voltage drop for this particular winding set is expected to be higher than for the (healthy or unimpaired) winding set. Despite the fact that most large machines are inherently unbalanced to some degree (which will be taken into account by applying an offset as explained below), the variation between normal and faulty operation may be detected by a suitable condition monitoring method as is proposed in embodiments of the present invention.

One basic principle of embodiments of the present invention is to monitor the second harmonic in the active and reactive instantaneous powers in all stators (i.e. stator windings) of a multi-stator generator and to exploit the deviations between different stators for diagnostic purposes, in order to detect which one of multiple winding sets is affected. Later on embodiments enable to detect which phase or wire of the faulty winding set is faulty, as described above.

By using information from multiple stators, robustness and sensitivity of the diagnostic method may be improved compared to conventional methods. In particular, robustness against transients, such as speed and power variations, may be improved. Further, false alarms may be avoided which may have been raised in conventional methods due to transients and inherent asymmetries.

In particular, also a faulty detection may be enabled under low load conditions and low severity faults according to embodiments of the present invention. Thus, a reliable and robust diagnosing method may be provided.

According to an embodiment of the present invention, the method further comprises obtaining a first power time average of the first power; obtaining a second power time average of the second power; wherein the diagnosing involves forming a power difference ratio proportional to a ratio between the second harmonic power difference and a sum, in particular an average, of the first power time average and the second power time average.

The first power time average and also the second power time average may be obtained by averaging over a particular time interval, in particular moving time interval. The respective power time average may be proportional to an amplitude of an oscillating power flux or power stream. The second harmonic power difference may be divided by the sum of the first power time average and the second power time average to obtain the power difference ratio. When this ratio is formed, the difference is normalized to the average in power output of the two winding sets, thereby appropriately relating the second harmonic power difference to the relevant power order. When the ratio is considered for further analysis, a threshold may not be required to be load dependent but could be set as fixed value. In other embodiments, the second harmonic power difference is considered without forming the ratio but respective thresholds may then be set to be load or power dependent. Forming the power difference ratio may further simplify the method and may in particular simplify setting the thresholds.

According to an embodiment of the present invention, diagnosing involves comparing a term derived from the power difference ratio with a difference threshold, wherein one of the first or the second winding set is diagnosed as faulty, if the absolute of the term is larger than the difference threshold.

When the absolute of the term is large, the difference between the first strength and the second strength is large, indicating that one of the winding sets is faulty. The term may be obtained as a value shifted by an offset from the power difference ratio. By considering the term instead of the power difference ratio as such, inherent (power output) differences between the first winding set and the second winding set may be taken into account. Thereby, for example false alarms may be avoided or at least reduced. The difference threshold may be set such that under normal conditions (i.e. healthy or not faulty winding sets), the absolute of the term is smaller than the difference threshold. The difference threshold may for example be set by analyzing not deteriorated or not faulty winding sets during operation. When the term is compared to the difference threshold, a simple diagnosing method may be carried out.

According to an embodiment of the present invention, the term is formed as the power difference ratio diminished by an offset being related to an expected difference of power output between the first winding set and the second winding set, both in a normal state.

From the power difference ratio, the offset may be subtracted to obtain the term. The offset may account for the inherent asymmetry of power output or inherent difference in configuration or constitution of the first winding set and the second winding set. By applying the offset, false alarms may be avoided or at least reduced. The offset may be determined from operational parameters, such as voltages, currents under normal, healthy conditions or measured in a healthy state. The offset can e.g. be either a constant or variable. In the second case, the offset may be defined as a function of the fundamental power. For instance, the expected offset may simply be given by a linear function:

$$\text{Expected\_offset} = \text{Expected\_}m * Pdc + \text{Expected\_}b,$$

wherein Pdc is the DC power value, Expected_m and Expected_b are fitting parameters or predetermined constants.

More complex relationships may be considered, but the results provided show that a good approximation can be obtained by means of a linear function.

In the case, where the generator has a single winding set, another method may have been performed to conclude that the winding set is faulty. For example, a power output of the generator may be estimated by applying a physical model to the generator which may enable to derive expected power output based on rotational speed, currents, voltages, and configuration of the generator. If the estimated power output deviates from the measured or otherwise obtained power output, it may be concluded that the winding set is faulty. It may then be desired to detect, which of the wires of the faulty winding set is faulty. Therefore, embodiments of diagnosing at least one winding set of a stator of a generator, as explained above, may be utilized.

It should be understood that features, individually or in any combination, disclosed, explained or provided for a method of diagnosing at least one winding set of a stator of a generator during operation may also be applied, individually or in any combination, to an arrangement for diagnosing at least one winding set of a stator of a generator during operation, according to embodiments of the present invention and vice versa.

According to an embodiment of the present invention it is provided an arrangement for diagnosing at least one winding set of a stator of a generator during operation, the winding set having plural wires for plural phases, the arrangement comprising: an processor adapted: to obtain, for each of the plural wires of the winding set, an individual strength of an individual power output from the respective wire of the plural wires of the winding set; to obtain a sum strength of power; to form, for each considered wire of the plural wires of the winding set, an individual ratio between the individual strength of the considered wire and the sum strength; to form, for each considered wire of the plural wires of the winding set, a diagnostic value by subtracting from an individual ratio not corresponding to the considered wire a term depending on the individual ratio corresponding to the considered wire; and to diagnose at least one wire based on comparing the diagnostic values.

The arrangement may for example be comprised of hardware and/or software, in a wind turbine controller.

According to an embodiment of the present invention it is provided a generator, in particular of a wind turbine, comprising: a stator having at least one winding set; a rotor rotatably supported relative to the stator and having plural permanent magnets; and an arrangement according to the preceding embodiment, connected for diagnosing the winding set.

BRIEF DESCRIPTION

Some of the embodiments will be described in detail, with reference to the following figures, wherein like designations denote like members, wherein.

DETAILED DESCRIPTION

The illustration in the drawings is in schematic form. It is noted that in different figures, similar or identical elements are provided with the same reference signs or with reference signs, which are different from the corresponding reference signs only within the first digit.

Figure 1:
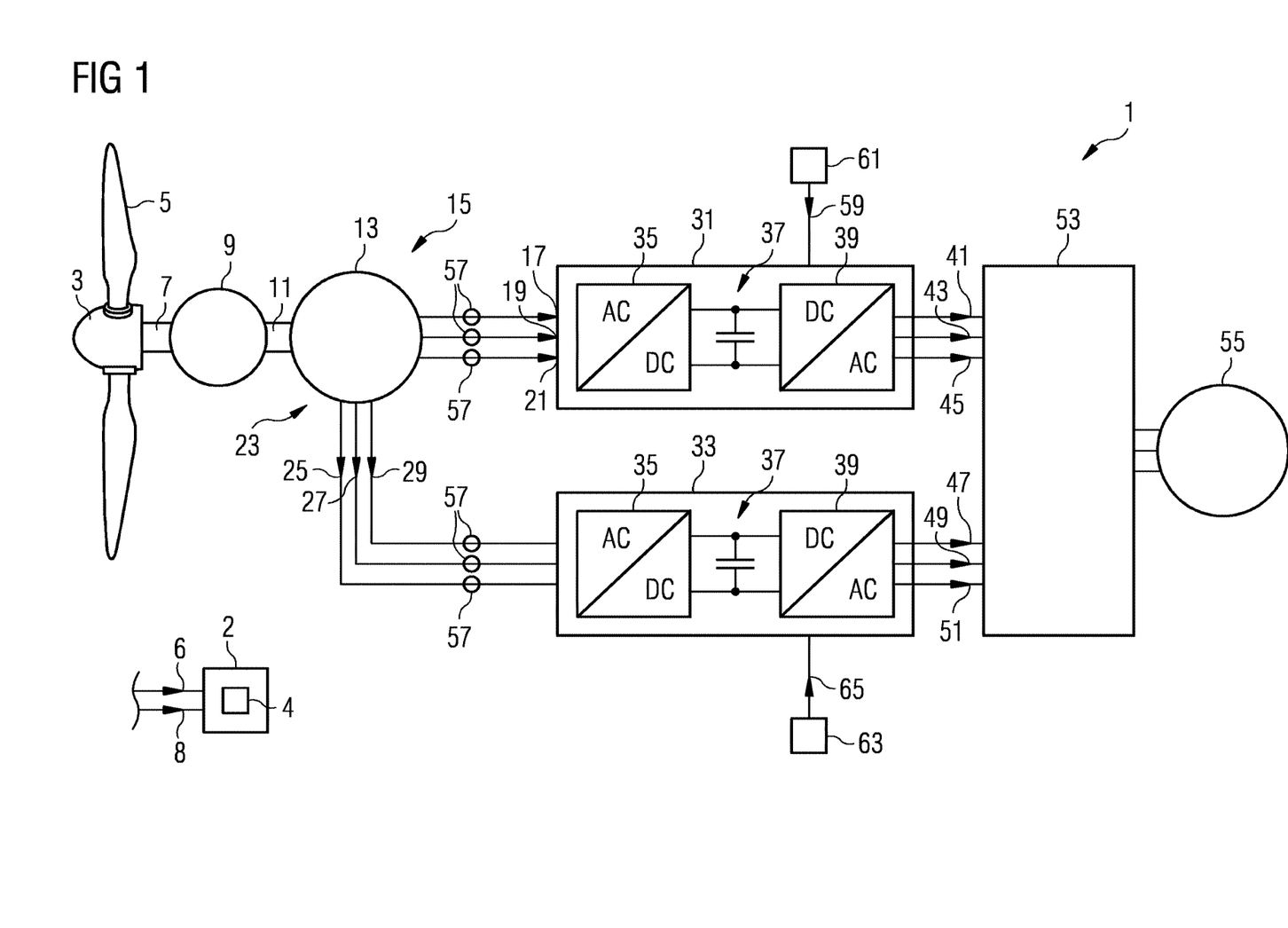
FIG. 1 schematically illustrates a wind turbine according to an embodiment of the present invention comprising a generator.

The wind turbine 1 schematically illustrated in FIG. 1 comprises a hub at which plural rotor blades 5 are connected. The hub 3 is connected to a rotation shaft 7 which is coupled to a gearbox 9 which is optional. A secondary shaft 11 coupled to another end of the gearbox 9 is coupled to a generator 13 having a two winding set stator in the illustrated example. According to other embodiments the generator has only a single winding set.

At a first winding set 15, in particular three-phase winding set, the generator 13 outputs first power as three phase currents 17, 19, 21. A second winding set 23 outputs second power 25, 27, 29 as three-phase currents. The first power 17, 19, 21 produced by the first winding set 15 is supplied to a first AC-DC-AC converter 31 and the second power 25, 27, 29 is supplied to a second AC-DC-AC converter 33. Thereby, the first converter 31 as well as the second converter 33 comprises an AC-DC converter portion 35, a DC link 37 and a DC-AC converter portion 39. The converters 31, 33 are configured for converting a variable frequency AC power stream 17, 19, 21 or 25, 27, 29, to a fixed frequency power stream, in particular three-phase power streams 41, 43, 45 or 47, 49, 51, respectively. The two power streams from the first winding set 15 and the second winding set 23 are transformed in a common transformer 53 to higher voltage to be provided as a three-phase power stream to a utility grid 55.

The wind turbine 1 illustrated in FIG. 1 further comprises an arrangement 2 according to an embodiment of the present invention for diagnosing at least one winding set of the stator comprised in the generator 13 during operation. Thereby, the arrangement 3 is configured to carrying out a method of diagnosing at least one winding set 15 or 23 or both winding sets 15 and 23 according to an embodiment of the present invention. Therefore, the arrangement 2 comprises a processor 4 which is configured to obtain, for each of the plural wires of the winding set, an individual strength of an individual power output from the respective wire of the plural wires of the winding set; to obtain a sum strength of power; to form, for each considered wire of the plural wires of the winding set, an individual ratio between the individual strength of the considered wire and the sum strength; to form, for each considered wire of the plural wires of the winding set, a diagnostic value by subtracting from an individual ratio not corresponding to the considered wire a term depending on the individual ratio corresponding to the considered wire; and to diagnose at least one wire based on comparing the diagnostic values.

The first winding set 15 and also the second winding set 23 each comprises three wires corresponding to the three different phases. According to other embodiments of the present invention, the first winding 15 and/or second winding 23 comprises more than three wires for more than three phases.

The individual power streams 17, 19, 21 for each of the three wires of the first winding set are obtained by the arrangement in a signal 6 and the individual power streams or output powers 25, 27 and 29 as output by the second winding set 23 or output by the three wires of the second winding set 23 are also obtained by the arrangement 2 as an input signal 8.

The phase active instantaneous power of the three wires of the first winding set 15 and/or the three wires of the second winding set 23 are for example given as:

$$p_a = u_a i_a$$

$$p_b = u_b i_b$$

$$p_c = u_c i_c \qquad (1)$$

The total instantaneous active power may be given as $$p = p_a + p_b + p_c \qquad (2)$$

where $u_{abc}$ and $i_{abc}$ stand for the phase voltages and phase currents, for example of the first winding set 15 or the second winding set 23.

According to other embodiments of the present invention, the wind turbine 1 comprises a generator which has only a single winding set having three wires for three different phases or even more different phases, but not a second winding set 23. Embodiments of the present invention enable to detect, which phase of a winding set is faulty.

Having obtained instantaneous active power from the above equations (1) and (2), diagnostic variables may be calculated for fault localization. Different possibilities or alternatives of calculating such signals are given below.

Option 1: The rms values of $p_{abc}$ are calculated and normalized by the total DC active power, giving the diagnostic signal as illustrated in the equation (3) below:

$$d_a = \frac{p_{a,rms}}{|p_{dc}|} \qquad (3)$$

$$d_b = \frac{p_{b,rms}}{|p_{dc}|}$$

$$d_c = \frac{p_{c,rms}}{|p_{dc}|}$$

Option 2: DC values of $p_{abc}$ are used instead as detailed in the equation (4) below:

$$d_a = \frac{|p_{a,dc}|}{|p_{dc}|} \qquad (4)$$

$$d_b = \frac{|p_{b,dc}|}{|p_{dc}|}$$

$$d_c = \frac{|p_{c,dc}|}{|p_{dc}|}$$

wherein the DC values may be obtained by means of a moving average or a low pass filter, whereas for the rms values the absolute value is calculated first and then averaged or low pass filtered. Under healthy operation conditions with negligible impedance unbalance between the phases (for example of the first winding set 15 and/or the second winding set 23), the ratios $d_{abc}$ are expected to assume identical values close to 1/3.

The quantities $dab_c$ may represent individual ratios for each wire of the winding set of the stator 13. The values $p_{a,rms}$ or $p_{a,DC}$ may represent individual strength of the individual powers of the wires of one winding set.

From the calculated individual ratios, diagnostic values (or phase localization signals) may be derived in distinct ways as detailed below.

According to a first option, the diagnostic value ($F_a$) of a considered wire is formed by subtracting from one individual ratio not corresponding to the considered wire at least the individual ratio corresponding to the considered wire, as is given in equation (5).

$$F_a = d_b - d_a - F_{a,healthy}$$

$$F_b = d_c - d_b - F_{b,healthy}$$

$$F_c = d_a - d_c - F_{c,healthy} \qquad (5)$$

According to a second option, the diagnostic value (for example $F_a$) of the considered wire is formed by subtracting from one individual ratio not corresponding to the considered wire at least a mean value of all individual ratios except the one individual ratio as detailed in the equation (6) below.

$$F_a = d_b - \frac{d_a + d_c}{2} - F_{a,healthy} \qquad (6)$$

$$F_b = d_c - \frac{d_a + d_b}{2} - F_{b,healthy}$$

$$F_c = d_a - \frac{d_b + d_c}{2} - F_{c,healthy}$$

where $F_{a,healthy}$ stands for the value assumed by $F_a$ under healthy operating conditions, which is approximately zero for a perfectly balanced three-phase generator, whereas it differs from zero when the phase impedances are inherently unbalanced (commonly, a consequence of production tolerances in large generators). For example, in (5) the $F_{a,healthy} = d_{b,healthy} - d_{a,healthy}$, wherein $d_{b,healthy}$ and $d_{a,healthy}$ correspond to the individual ratios as defined for the different options in equations (3) and (4) when the corresponding wires of the winding set are healthy, undamaged and unimpaired. The same is valid for the remaining phases c and d. The expected unbalance given by $F_{abc,healthy}$ may be obtained by means of simulations, experimental tests or automatic identification by the control signal.

It is worth noting, that in embodiments of the present invention, if the initial values of the false localization signals or diagnosing signals or diagnostic values ($F_{abc,healthy}$) were not taken into account, and a fault is detected at an early stage (low severity level), the inherent unbalance of the generator may lead to an erroneous fault localization. Thus, when the diagnostic values as calculated in the healthy state are taken into account, the number of false positives may be reduced.

According to simulation results, the calculations of $d_{abc}$ and $F_{abc}$ by using equations (3) and (5), respectively, may provide increased sensitivity, thus their practical implementation may be exemplary relative to the other options.

Therefore, once a fault in a particular winding set is detected (for example in the first winding set 15 or in the second winding set 23), embodiments of the present invention enable to localize the faulty wire of the winding set previously being identified as a faulty winding set. Thereby, the diagnostic values $F_a$, $F_b$, $F_c$ are evaluated. The highest value of the fault localization signal, i.e. diagnostic signal or value, corresponds to the faulty phase as is illustrated in the table 1 below.

TABLE 1

| Faulty phase | Fault signature |
|---|---|
| a | $\max(F_a, F_b, F_c) == F_a$ |
| b | $\max(F_a, F_b, F_c) == F_b$ |
| c | $\max(F_a, F_b, F_c) == F_c$ |

It should be noted that no thresholds are required, since the fault detection is carried out by a distinct method.

Figure 2:
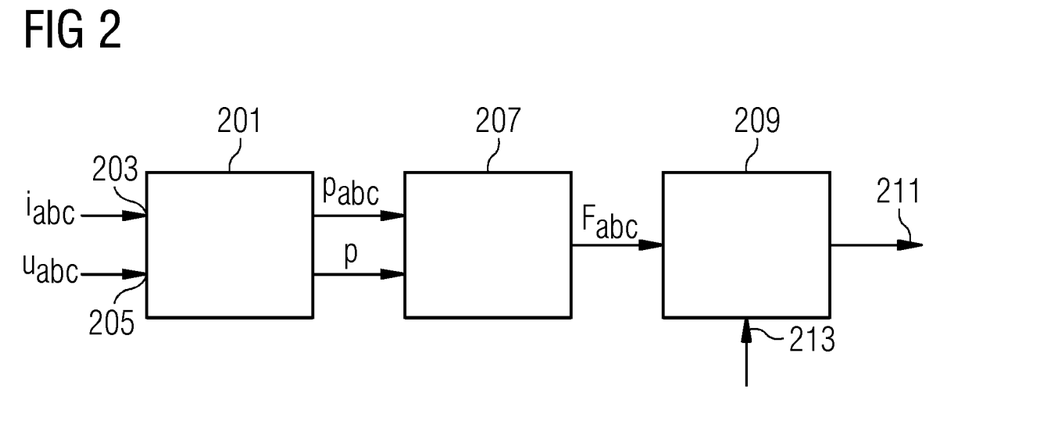
FIG. 2 schematically illustrates a block diagram of a fault localization method or method of diagnosing at least one winding set of a stator of a generator during.

A method diagram of a method of diagnosing a winding set of a stator is schematically illustrated in FIG. 2. A power calculation block 201 receives three phase currents $i_a$, $i_b$ and $i_c$ commonly denoted by reference sign 203. Furthermore, the power calculation module 201 receives the three voltages $u_a$, $u_b$, and $u_c$ of all three wires of one winding set, for example the first winding set 15 or the second winding set 23 which voltage values are commonly labelled with reference sign 205. The power calculation module calculates for example according to equations (1) and/or (2) the individual power $p_{abc}$ for each phase a, b, c of the windings and also the sum of the powers, as given by equation (2) which is denoted by p.

The individual powers and the sum power is input into a diagnostic signal calculation block 207 which calculates the diagnostic values according to equation (5) or equation (6) for the different options, wherein the diagnostic values are labelled as $F_{abc}$.

The diagnostic values are input in a fault localization logic 209 which compares the diagnostic values $F_a$, $F_b$ $F_c$ for the different wires (corresponding to the different phases) of one winding set and provides an output 211 indicating which of the phases and thus which of the wires of the winding set is faulty. The fault localization logic further receives a fault detection flag 213. The fault detection flag 213 enables/triggers output 211, since fault localization may be allowed/performed only after fault detection is accomplished (fault detected in one set of windings).

The method in FIG. 2 is illustrated for a single three-phase winding generator, but it may also be implemented in multiple winding machines. In the case of multiple winding machines, the method illustrated in FIG. 2 may for example be implemented in the control systems of each frequency converter 31 and/or 33 as shown in FIG. 1. According to embodiments of the present invention, the arrangement 2 may be contained within the controllers 61 and 63.

Figure 3:
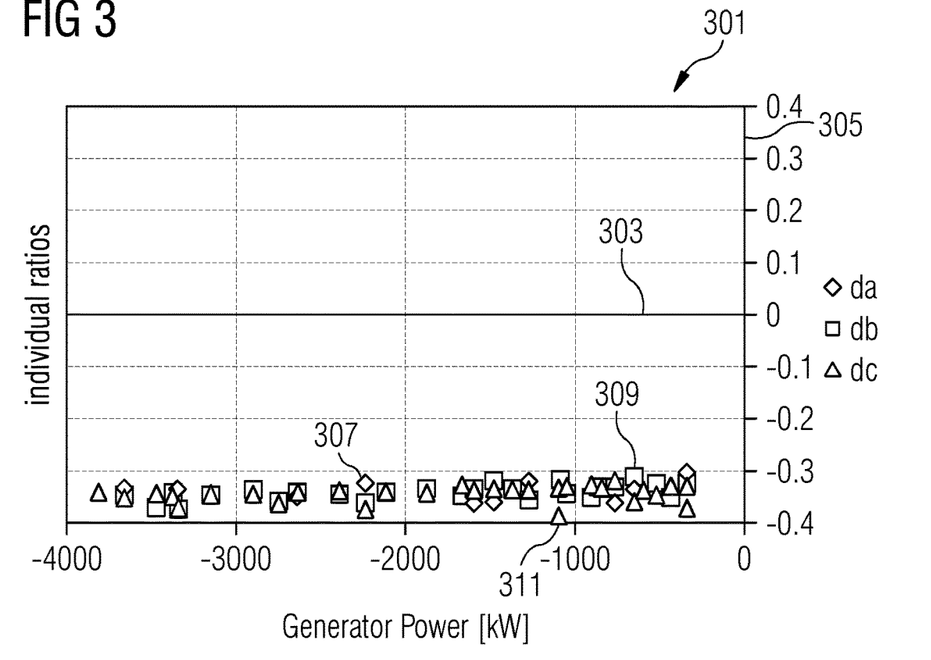
FIG. 3 illustrates a graph with quantities or diagnostic signals as configured.
Figure 4:
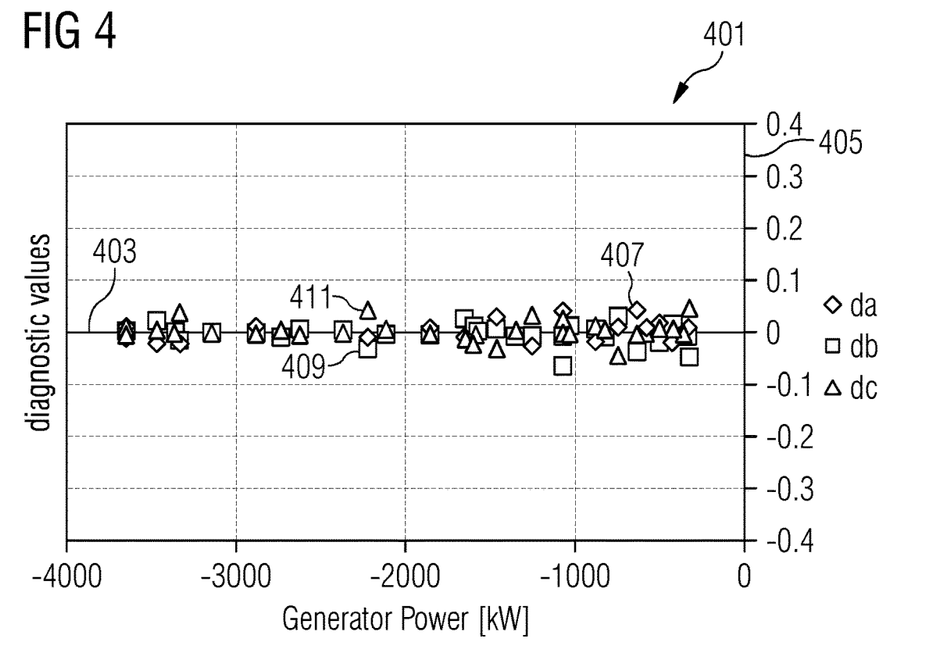
FIG. 4 illustrates a graph with quantities or diagnostic signals as configured.

FIGS. 3 and 4 illustrate graphs 301, 401 showing individual ratios $d_a$, $d_b$, $d_c$ in FIG. 3 and diagnostic values $F_a$, $F_b$, and $F_c$ in FIG. 4 as diamonds, squares and triangles for the phases a, b and c of healthy wires of a winding set, respectively. Thereby, an abscissa 303, 403 indicates the generator power and the ordinate 305, 405 indicates the magnitude of the individual ratio in FIG. 3 or the diagnostic value in FIG. 4. Thus, FIGS. 3 and 4 illustrate the experimental data for a healthy dual stator PM generator as is for example illustrated in FIG. 1.

The individual ratios for the phases a, b and c are indicated in FIG. 3 with reference signs 307, 309, 311, all being close to the expected value of 1/3.

As can be taken from FIG. 4, the diagnostic values $F_{a,b,c}$ are close to zero, wherein the diagnostic values for phase a, b and c are labelled by reference signs 407, 409, 411, respectively. In the present case, the application of a healthy diagnostic value $F_{abc,healthy}$ may be avoided for the particular considered generator.

Moreover, by combining experimental and simulation results, it was observed that a resistance increase equal or higher than 150% in one of the phases would be accurately localized in all operating conditions, i.e. between 4,000 and 0 kW of generator power. Concerning the localization of the high resistance connections of lower severity (increase below 150%), an accurate knowledge of $F_{abc,healthy}$ may most probably be required.

Embodiments of the present invention provide a solution for online condition monitoring of generators employed in wind turbines. Further, a diagnostic method is provided to localize the faulty phase in an electrical machine, namely the phase with increased impedance. Furthermore, a diagnostic method is provided to localize high resistance connections in the stator of permanent magnet generators, including single and multiple winding generators.

The described diagnostic method may aid service of wind turbines, such as offshore turbines. A diagnostic method suitable for implementation in the controller of the frequency converter is described according to embodiments of the present invention.

Although the invention has been illustrated and described in greater detail with reference to the preferred exemplary embodiment, the invention is not limited to the examples disclosed, and further variations can be inferred by a person skilled in the art, without departing from the scope of protection of the invention.

For the sake of clarity, it is to be understood that the use of "a" or "an" throughout this application does not exclude a plurality, and "comprising" does not exclude other steps or elements.

The invention claimed is:

1. A method of diagnosing at least one winding set of a stator of a generator during operation, the winding set having plural wires for plural phases, the method comprising:

obtaining, for each of the plural wires of the winding set, an individual strength of an individual power output from the respective wire of the plural wires of the winding set;

obtaining a sum strength of power;

forming, for each considered wire of the plural wires of the winding set, an individual ratio between the individual strength of the considered wire and the sum strength;

forming, for each considered wire of the plural wires of the winding set, a diagnostic value by subtracting from an individual ratio not corresponding to the considered wire a term depending on the individual ratio corresponding to the considered wire;

diagnosing at least one wire based on comparing the diagnostic values.

2. The method according claim 1, wherein the at least one wire is diagnosed as faulty to which the largest diagnostic value is associated.

3. The method according to claim 1, wherein the diagnostic value of the considered wire is formed by subtracting from one individual ratio not corresponding to the considered wire at least a mean value of all individual ratios except the one individual ratio.

4. The method according to claim 3, wherein the diagnostic value of the considered wire is formed by further subtracting a diagnostic value of the considered wire obtained in a healthy state of the considered wire.

5. The method according to claim 1, wherein the diagnostic value of the considered wire is formed by subtracting from one individual ratio not corresponding to the considered wire at least the individual ratio corresponding to the considered wire.

6. The method according to claim 1, wherein the sum strength of power is a DC value of the sum of powers of all wires.

7. The method according to claim 1, wherein the individual strength of the individual power of the considered wire is an rms-value or a DC value of the individual power output by the considered wire.

8. The method according to claim 1, wherein the DC value of power is obtained as moving average or by low pass filtering of the instantaneous power.

9. The method according to claim 1, wherein it has previously been diagnosed that the winding set is faulty by performing a method of diagnosing a first winding set and at least one second winding set of a stator of a generator during operation, the method comprising:

obtaining a first strength of a second harmonic of a first power produced from the first winding set;

obtaining a second strength of a second harmonic of a second power produced from the second winding set;

diagnosing the first winding set and/or the second winding set based on a second harmonic power difference between the first strength and the second strength.

10. The method according to claim 9, further comprising: obtaining a first power time average of the first power;

obtaining a second power time average of the second power;

wherein the diagnosing involves forming a power difference ratio proportional to a ratio between the second harmonic power difference and a sum, in particular an average, of the first power time average and the second power time average.

11. The method according to claim 9, wherein diagnosing involves comparing a term derived from the power difference ratio diminished by a difference threshold, wherein one of the first or the second winding set is diagnosed as faulty, if the absolute of the term is larger than the difference threshold.

12. The method according to claim 9, wherein the term is formed as the power difference ratio diminished by an offset being related to an expected difference of power output between the first winding set and the second winding set, both in a normal state.

13. The method according to claim 1, wherein the power is active instantaneous power.

14. An arrangement for diagnosing at least one winding set of a stator of a generator during operation, the winding set having plural wires for plural phases, the arrangement comprising:

a processor adapted:

to obtain, for each of the plural wires of the winding set, an individual strength of an individual power output from the respective wire of the plural wires of the winding set;

to obtain a sum strength of power;

to form, for each considered wire of the plural wires of the winding set, an individual ratio between the individual strength of the considered wire and the sum strength;

to form, for each considered wire of the plural wires of the winding set, a diagnostic value by subtracting from an individual ratio not corresponding to the considered wire a term depending on the individual ratio corresponding to the considered wire; and to diagnose at least one wire based on comparing the diagnostic values.

15. A generator of a wind turbine, comprising:

a stator having at least one winding set;

a rotor rotatably supported relative to the stator and having plural permanent magnets; and the arrangement according to claim 14, connected for diagnosing the winding set.

* * * * *